(12) United States Patent
Chen

(10) Patent No.: US 10,779,401 B2
(45) Date of Patent: Sep. 15, 2020

(54) FLEXIBLE PRINTED CIRCUIT BOARD AND MOBILE TERMINAL

(71) Applicant: Guangdong Oppo Mobile Telecommunications Corp., Ltd., Dongguan, Guangdong (CN)

(72) Inventor: Yan Chen, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 0 days.

(21) Appl. No.: 15/993,636

(22) Filed: May 31, 2018

(65) Prior Publication Data

US 2018/0279468 A1 Sep. 27, 2018

Related U.S. Application Data

(63) Continuation of application No. PCT/CN2016/095689, filed on Aug. 17, 2016.

(30) Foreign Application Priority Data

Dec. 29, 2015 (CN) .......................... 2015 1 1025993

(51) Int. Cl.
*H05K 1/02* (2006.01)
*H05K 1/18* (2006.01)

(52) U.S. Cl.
CPC .......... *H05K 1/0281* (2013.01); *H05K 1/028* (2013.01); *H05K 1/0278* (2013.01); *H05K 1/189* (2013.01);

(Continued)

(58) Field of Classification Search
CPC ....... H05K 1/0281; H05K 2201/09845; H05K 2201/2009

See application file for complete search history.

(56) References Cited

U.S. PATENT DOCUMENTS 5,986,217 A 11/1999 Strum
6,602,584 B2 * 8/2003 Jo ............................ B32B 7/00
428/209

(Continued)

FOREIGN PATENT DOCUMENTS

CN 1929719 A 3/2007
CN 1956624 A 5/2007

(Continued)

OTHER PUBLICATIONS

English Translation of CN105636333A (maching translation), Published: Jun. 1, 2016.*

(Continued)

*Primary Examiner* — Ishwarbhai B Patel

(57) ABSTRACT

A flexible printed circuit board (FPC) is provided, which includes a dielectric layer. Copper foil layers and cover layers are sequentially provided from inside to outside on both sides of the dielectric layer. The cover layer on one side of the dielectric layer is provided with a reinforced plate. The FPC includes a bending area. The copper foil layer and the cover layer on one side at the bending area and the reinforced plate are each provided with a windowed area. Edges of the copper foil layer, the cover layer, and the reinforced plate that are defined by windowed areas are not in one vertical plane. In the structure, stress concentrations in the bending area are distributed, so that the tearing risk to the edges of the bending area is reduced, and the bending resistance of the flexible circuit board is enhanced.

18 Claims, 3 Drawing Sheets

(52) U.S. Cl.
CPC .............. *H05K 2201/09845* (2013.01); *H05K 2201/2009* (2013.01)

(56) References Cited

U.S. PATENT DOCUMENTS

| | | | |
|---|---|---|---|
| 7,476,812 B2* | 1/2009 | Nakajima | H05K 1/0281 174/117 F |
| 9,247,651 B2* | 1/2016 | Watanabe | H05K 1/0281 |
| 2001/0010303 A1* | 8/2001 | Caron | H05K 3/4691 216/18 |
| 2006/0176069 A1* | 8/2006 | Takayoshi | H05K 1/0269 174/255 |
| 2007/0049060 A1* | 3/2007 | Nakajima | H05K 1/0281 439/55 |

FOREIGN PATENT DOCUMENTS

| | | |
|---|---|---|
| CN | 201426210 Y | 3/2010 |
| CN | 201854502 U | 6/2011 |
| CN | 202018547 U | 10/2011 |
| CN | 102395246 A | 3/2012 |
| CN | 102458036 A | 5/2012 |
| CN | 202310283 U | 7/2012 |
| CN | 102652338 A | 8/2012 |
| CN | 202364466 U | 8/2012 |
| CN | 103493610 A | 1/2014 |
| CN | 203416496 U | 1/2014 |
| CN | 203661410 U | 6/2014 |
| CN | 105636333 A | 6/2016 |
| JP | S58116267 U | 8/1983 |
| JP | H06314860 A | 11/1994 |

OTHER PUBLICATIONS

International search report issued in corresponding international application No. PCT/CN2016/095689 dated Nov. 30, 2016.
European examination report issued in corresponding European application No. 16880606.5 dated Jul. 31, 2019.

* cited by examiner

FLEXIBLE PRINTED CIRCUIT BOARD AND MOBILE TERMINAL

CROSS-REFERENCE TO RELATED APPLICATION(S)

This application is a continuation of International Application No. PCT/CN2016/095689, filed on Aug. 17, 2016, which claims priority to Chinese Patent Application 201511025993.9, filed on Dec. 29, 2015, the contents of both of which are hereby incorporated by reference in their entireties.

TECHNICAL FIELD

The present disclosure relates to a flexible printed circuit board, and more particularly to a flexible printed circuit board and a mobile terminal having a reinforced structure at the edge of a bending area.

BACKGROUND

Due to the flexible and soft nature of the flexible printed circuit board (FPC), it is ideally suited for scenes where parts of a phone are often repetitively bent. Taking a flexible circuit board as an example, copper foil layers, adhesive layers, and cover layers are respectively disposed on both sides of the dielectric layer. The two copper foil layers are respectively plated on the upper and lower sides of the dielectric layer, and each cover layer covers over the corresponding copper foil layer via the respective adhesive layer.

On flexible circuit boards, certain special areas need to be particularly flexible and easy to bend repeatedly. In the current design of flexible circuit boards, single-sided traces are generally adopted, i.e., the copper skin of the remaining layers is cut off, and the cover layer covering the surface of the copper skin is also removed, so that this local area is thin and easy to bend in use. The copper foil layer, the adhesive layer, and the cover layer on the dielectric layer are cut off to form the bending area of the flexible circuit board. This process is also called "window processing" to reduce the thickness of the bending area of the flexible circuit board to make it more flexible and easy to bend.

SUMMARY

The disclosure aims to provide a flexible printed circuit board (FPC) which is capable of reducing the risk of edges of a bending area being easily torn.

The disclosure further aims to provide a mobile terminal using the above flexible printed circuit board.

To achieve the above objective, implementations of the present disclosure provide the following technical solutions.

A flexible printed circuit board is provided. The flexible printed circuit board includes a dielectric layer. A copper foil layers and a cover layer are sequentially disposed from inside to outside on each side of the dielectric layer, and the cover layer on one side of the dielectric layer is provided with a reinforced plate. The flexible printed circuit board includes a bending area, the copper foil layer, the cover layer on one side at the bending area and the reinforced plate are each provided with a windowed area, and edges of the copper foil layer, the cover layer, and the reinforced plate that define the windowed areas are not in one vertical plane.

A mobile terminal is provided. The mobile terminal includes a flexible printed circuit board. The flexible printed circuit board includes a dielectric layer, copper foil layers, and cover layers are sequentially disposed from inside to outside on both sides of the dielectric layer, and the cover layer on one side of the dielectric layer is provided with a reinforced plate. The flexible printed circuit board includes a bending area, the copper foil layer, the cover layer on one side at the bending area and the reinforced plate are each provided with a windowed area, and edges of the copper foil layer, the cover layer, and the reinforced plate that define the windowed areas are not in one vertical plane.

BRIEF DESCRIPTION OF THE DRAWINGS

To illustrate technical solutions embodied by the implementations of the present disclosure or by the related art more clearly, the following briefly introduces the accompanying drawings required for describing the implementations or the related art. Apparently, the accompanying drawings in the following description merely illustrate some implementations of the present disclosure. Those of ordinary skill in the art may also obtain other drawings based on these accompanying drawings without creative efforts.

DETAILED DESCRIPTION

Figure 1:
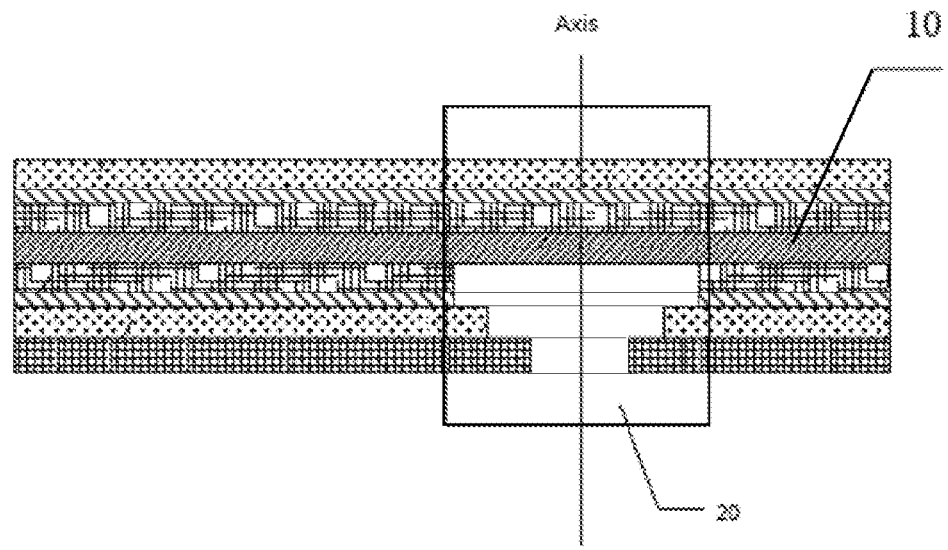
FIG. 1 is a schematic structural diagram of a flexible circuit board with a bending area of the present disclosure.

All other implementations obtained are within the protection scope of the present disclosure.

Implementations of the present disclosure are mainly directed to a flexible circuit board (FPC) with a specific structure. The flexible circuit board can be disposed in various types of terminals that need to be configured with a flexible circuit board, in particular, some mobile terminals that have bending requirements. In the implementations of the present disclosure, the flexible circuit board includes a dielectric layer, and a copper foil layer and a cover layer are sequentially disposed on each side of the dielectric layer from inside to outside, and a cover layer on one side of the dielectric layer is provided with a reinforced plate. The flexible circuit board includes a bending area. The copper foil layer, the cover layer on one side at the bending area and the reinforced plate are each provided with a windowed area, and edges of the copper foil layer, the cover layer, and the reinforced plate that define the windowed areas are not in one vertical plane.

In some implementations, the cover layer and the copper foil layer are connected via an adhesive layer. The windowed area of the copper foil layer, the adhesive layer, and the cover layer, and the windowed area of the reinforced plate are arranged on the same side of the dielectric layer. As one implementation, the edges of the copper foil layer, the adhesive layer, the cover layer, and the reinforced plate that define the windowed areas are arranged in a stepped manner.

In some other implementations, the cover layer and the copper foil layer are connected via an adhesive layer, the windowed area of the reinforced plate and the windowed area of the copper foil layer, the adhesive layer, and the cover layer are arranged on different sides of the dielectric layer. As one implementation, the edge of the cover layer extends toward the inside of the windowed area of the cover layer to exceed and cover the edges of the copper foil layer and the adhesive layer, and the edge of the reinforced plate defined by the windowed area of the reinforced plate exceeds the edge of the cover layer defined by the windowed area of the cover layer.

As one implementation, the cover layer and the copper foil layer are connected via an adhesive layer, a horizontal distance of any two of the edges of the copper foil layer, the adhesive layer, the cover layer, and the reinforced plate that define the windowed area is not less than 0.3 mm. In one implementation, the horizontal distance of any two of the edges of the copper foil layer, the adhesive layer, the cover layer, and the reinforced plate that define the windowed areas is 0.4 mm, or 0.5 mm, or 0.6 mm. As one implementation, the reinforced plate is made of a metal alloy plate. As one implementation, the reinforced plate has a thickness greater than or equal to 0.1 mm. As one implementation, the reinforced plate is fixed on the cover layer through welding or adhesive.

In the FPC of the present disclosure, windowed areas are formed on the copper foil layer, the cover layer, and the reinforced plate to form the bending area, and edges of the copper foil layer, the cover layer, and the reinforced plate in the bending area are not in the same vertical plane. It is possible to disperse stress concentration points of the bending area, and reduce the risk of the edge of the bending area being easily torn and enhance the bending resistance of the flexible circuit board.

Figure 2:
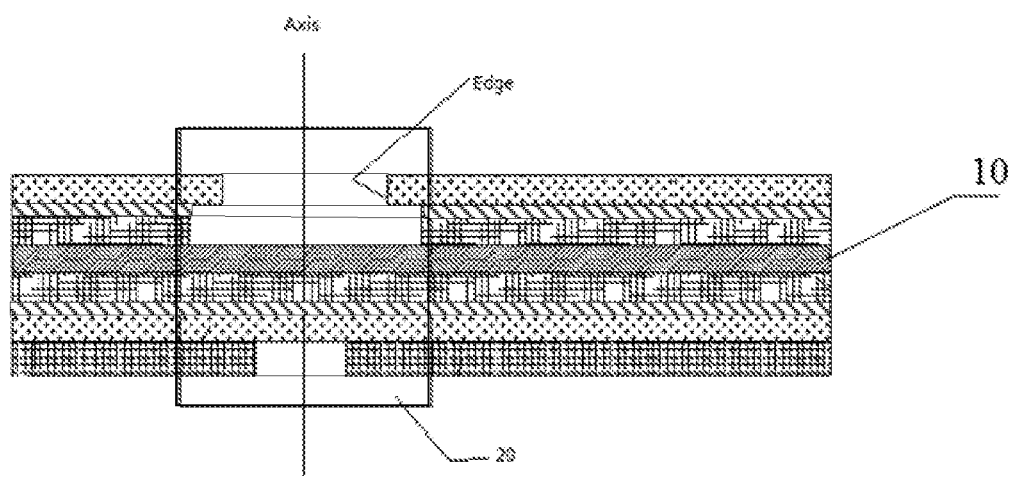
FIG. 2 is another schematic structural diagram of a flexible circuit board with a bending area of the present disclosure.

As illustrated in FIG. 1 and FIG. 2, the FPC provided herein has a bending area 10. The bending area 20 refers to an area that is easy to bend or may be frequently bent when the FPC is in use, rather than an area that is actually bent when manufactured. The boundary of the bending area is not particularly limited here. As illustrated, the boundary of the bending area can be close to or coincide with an edge(s) of a layer defined by the windowed area, which edge is most far away from the axis. The bending area 20 is subjected to window processing to form the windowed area on the layers. As illustrated in FIG. 1, the windowed area can be formed as a whole on one side of the dielectric layer 10. That is, in FIG. 1, the windowed area of the reinforced plate and the windowed area of the other layers can be treated as one windowed area or can be treated as two windowed areas, this does not affect the essence of the disclosure. Alternatively, the windowed area can be formed as different parts on both sides of the dielectric layer 10. For ease of explanation, the windowed area on one side of the dielectric layer 10 can be referred to as a first windowed area and the windowed area on the other side of the dielectric layer 10 can be referred to as a second windowed area.

For the windowed area on the same side of the dielectric layer 10 (the lower surface of the dielectric layer 10 illustrated in FIG. 1), it can be formed fully integrated in one operation step, or the windowed area on the same side can be formed separately for each layer in different operation steps.

The windowed area may be axis-symmetric in the vertical direction. In the vertical direction, each layer in the windowed area has two edges defined by the windowed area. In the following, unless particularly indicated, when we refer to the edge of the layer, it means one among the two edges of the layer. Similarly, when we refer to the historical distance from an edge of a layer to another edge of another, the edge and another edger refer to the edges on the same side of the axis.

Implementations of the present disclosure will be detailed below.

According to one implementation of the present disclosure, an FPC with a windowed area(s) is provided. The FPC includes a dielectric layer. On one side of the dielectric layer, a first copper foil layer is coupled to the dielectric layer, and a first cover layer is coupled to the copper foil layer. A first adhesive layer is coupled between the copper foil layer and the cover layer. Similarly, on the other side of the dielectric layer, a second copper foil is coupled to the dielectric layer, and a second cover layer is coupled to the second copper foil layer. A second adhesive layer is coupled between the second copper foil layer and the second cover layer. The FPC also includes a reinforced plate coupled to one of the first cover layer and the second cover layer.

According to another implementation of the present disclosure, an FPC is provided.

The FPC includes a dielectric layer, two copper foil layers, two cover layers, and a reinforced plate. One copper foil layer is coupled to one side of the dielectric layer and the other copper foil layer is coupled to the other side of the dielectric layer. One cover layer is coupled to one copper foil layer and the other cover layer is coupled to the other copper foil layer. The reinforced plate is stacked on one cover layer.

The reinforce plate is provided with a first windowed area, one of the two copper foil layers and one of the two cover layers on the same side of the dielectric layer are provided with a second windowed area and a third windowed area respectively, wherein orthographic projection of the first, second, and third windowed areas on the dielectric layer are overlapped.

The copper foil layer and the cover layer on each side of the dielectric layer are connected via an adhesive layer respectively, and the second windowed area is vertically extended into the adhesive layer which is on the same side of the dielectric layer as the second windowed area.

The first, second, and third windowed areas are different in areas and are axis-symmetric in a vertical direction.

The first windowed area is larger or smaller than the second and third windowed areas.

First Implementation

Figure 3:
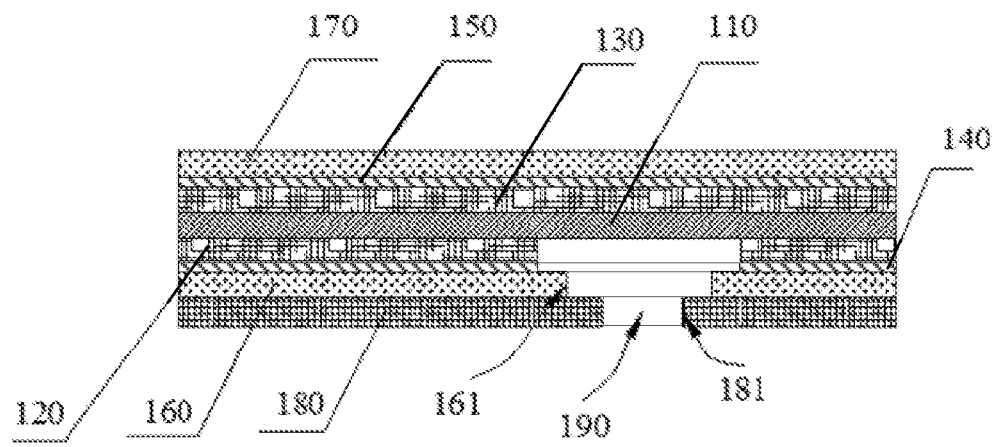
FIG. 3 is a schematic structural diagram of a first implementation of a flexible circuit board with a windowed area of the present disclosure.

Referring to FIG. 3, the FPC includes a dielectric layer 110, a copper foil layer 120, a copper foil layer 130, a cover layer 160, a cover layer 170, and a reinforced plate 180. The copper foil layer 120 is arranged on a lower surface of the dielectric layer 110, and the copper foil layer 130 is arranged on an upper surface of the dielectric layer 110. The cover layer 160 is disposed on the outer side (that is, the side away from the dielectric layer) of the copper foil layer 120 and the cover layer 170 is disposed on the outer side of the copper foil layer 130. The copper foil layer 120 and the cover layer 160 are connected via an adhesive layer 140 and the copper foil layer 130 and the cover layer 170 are connected via an adhesive layer 150. The reinforced plate 180 is disposed on the outer side (that is, the side away from the adhesive layer 140) of the cover layer 160. The reinforced plate 180 can realize the local reinforcing performance of the FPC. The FPC includes a bending area as illustrated in FIG. 1. The bending area of the FPC needs to be subjected to window processing, that is, the copper foil layer 120, the adhesive layer 140, the cover layer 160, and the reinforced plate 180 disposed on the dielectric layer 110 of the bending area are cut off. In other words, the windowed area is disposed on the side of the reinforced plate 180. An edge 161 of the cover layer 160 extends toward the inside of the windowed area 190 to exceed and cover the edge of the copper foil layer 120 and the edge of the adhesive layer 140. Similarly, an edge(s) 181 of the reinforced plate 180 also extends toward the inside of the windowed area 190 to exceed and cover edge(s) of the cover layer 160. In other words, the copper foil layer 120, the cover layer 160, and the reinforced plate 180 are arranged in a stepped manner, so that in the bending area, edges of the copper foil layer 120, the cover layer 160, and the reinforced plate 180 are not aligned with each other and not in one vertical plane.

In the implementation, in the bending area, the edges of the copper foil layer 120, the cover layer 160, and the reinforced plate 180 are arranged in a stepped manner, a height difference between the edge of the copper foil layer and the edge of the reinforced plate is buffered, which can disperse the concentrated stress points, so that the FPC will not be broken when the FPC is bent, and the bending resistance of the FPC can be enhanced.

Further, in an implementation of the edge reinforced structure of the bending area of the FPC, the extended edge(s) 161 of the cover layer 160 may exceed the edge(s) of the copper foil layer 120 and the edge(s) of the adhesive layer 140 by more than 0.3 mm, for example, 0.4 mm, 0.5 mm, 0.6 mm, or the like. Similarly, the extended edge(s) 181 of the reinforced plate 180 may exceed the edge(s) of the cover layer 160 by more than 0.3 mm, for example, 0.4 mm, 0.5 mm, 0.6 mm, or the like. If the horizontal distance between the extended edge 161 of the cover layer 160 and the extended edge 181 of the reinforced plate 180 is too long, the bending performance of the FPC will be affected. Therefore, the upper limit of the size that the extended edge 161 of the cover layer 160 exceeds the edges of the copper foil layer 120 and the adhesive layer 140 as well as the upper limit of the size that the extended edge 181 of the reinforced plate 180 exceeds the edge of the cover layer 160 depend on the size of the windowed area 190.

Further, the copper foil layer 120 (or the copper foil layer 130) is composed of a rolled copper foil or electrolytic copper foil having a thickness of 5 µm to 50 µm. The cover layer 160 (or the cover layer 170) is generally made of a polyimide (PI) film or a polyethylene terephthalate (PET) film having a thickness of 5 µm to 50 µm. The cover layer 160 is adhered to the copper foil layer 120 via the adhesive layer 140 and then firmly bonded by hot pressing; similarly, the cover layer 170 is adhered to the copper foil layer 130 via the adhesive layer 150 and then firmly bonded by hot pressing. The reinforced plate 180 can be made of a non-metal plate having a certain strength, or can be made of a stainless plate or an aluminum plate having a thickness of 0.1 mm or more, or can be made a metal alloy plate having a certain strength and having a thickness of 0.1 mm or more. The reinforced plate 180 may be fixed on the cover layer 160 through welding or adhesive.

Obviously, in this implementation, the edge of the copper foil layer 120 may also extend toward the edge of the windowed area 190 to exceed the extended edge 161 of the cover layer 160. Similarly, the extended edge 161 of the cover layer 160 exceeds the edge of the reinforced plate 180. In this way, the copper foil layer 120, the cover layer 160, and the reinforced plate 180 can also be formed in a stepped manner, so that the edges of the copper foil layer 120, the cover layer 160, and the reinforced plate 180 defined by the windowed area of the bending area are not aligned with each other. Therefore, dispersing the concentrated stress points.

Obviously, in the implementation of the present disclosure, the cover layer 160 may also be directly covered on the copper foil layer 120 through a thermosetting process, and the cover layer 170 can be directly covered on the copper foil layer 130 through a thermosetting process as well. In this case, the adhesive layer 140 and the adhesive layer 150 can be omitted.

Second Implementation

Figure 4:
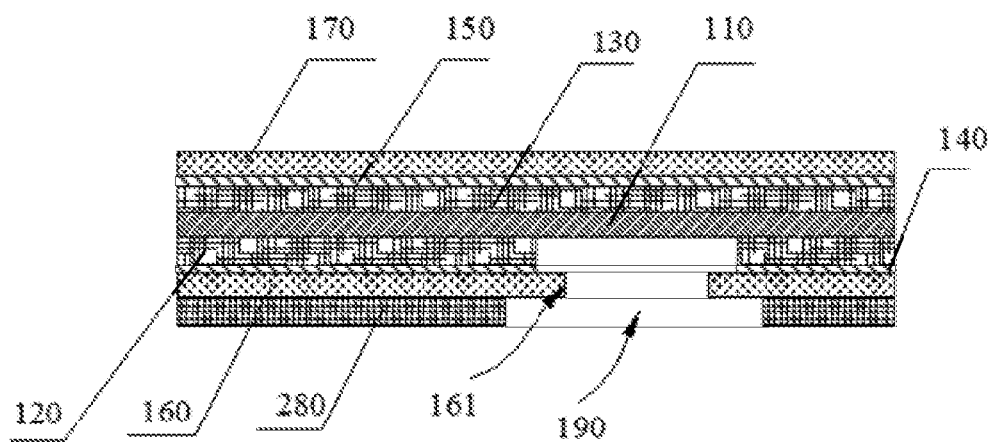
FIG. 4 is a schematic structural diagram of a second implementation of a flexible circuit board with a windowed area of the present disclosure.

Referring to FIG. 4, the difference between the second implementation and the first implementation is that in the windowed area 190, the extended edge 161 of the cover layer 160 exceeds the edge of the reinforced plate 280, the edge of the copper foil layer 120, and the edge of the adhesive layer 140. In addition, the edge of the copper foil layer 120 exceeds the edge of the reinforced plate 280. The edges of the copper foil layer 120, the cover layer 160, and the reinforced plate 280 defined by the windowed area 190 are staggered. In other words, the edge of the reinforced plate 280 and the edge the copper foil layer 120 are not in a vertical plane.

In the implementation, the edge of the copper foil layer 120, the edge of the cover layer 160, and the edge of the reinforced plate 180 defined by the windowed area of the bending area are staggered (that is, not aligned with each other) in the vertical direction, such that the height difference between the edge of the copper foil layer and the edge of the reinforced plate and the height difference between the edge of the copper foil layer and the edge of the cover layer have a buffer, which disperses the concentrated stress points, so that the FPC will not be broken when bent, and the bending resistance of the FPC can be enhanced.

Further, in an implementation of the edge reinforced structure of the bending area of the FPC, the extended edge 161 of the cover layer 160 may exceed the edge of the copper foil layer 120 and the edge of the adhesive layer 140 by more than 0.3 mm, such as 0.4 mm, 0.5 mm, 0.6 mm, or the like. Likewise, a horizontal distance between the edge of the reinforced plate 280 and the edge of the copper foil layer 120 is greater than or equal to 0.3 mm, such as 0.4 mm, 0.5 mm, 0.6 mm, or the like. If the extended edge 161 of the cover layer 160 extends too much in the windowed area, the bending performance of the FPC will be affected, and if the horizontal distance from the edge of the reinforced plate 280 to the edge of the copper foil layer 120 is too long, the reinforcing effect of the FPC can also be affected. Therefore, the upper limit of the size that the extended edge 161 of the cover layer 160 exceeds the edge of the copper foil layer 120 and the edge of the adhesive layer 140 as well as the upper limit of the size of the horizontal distance between the edge of the reinforced plate 280 and the edge of the copper foil layer 120 depends on the size of the windowed area 190.

Further, the copper foil layer 120 (or the copper foil layer 130) is composed of a rolled copper foil or electrolytic copper foil having a thickness of 5 µm to 50 µm. The cover layer 160 (or the cover layer 170) is generally made of a polyimide (PI) film or a polyethylene terephthalate (PET) film having a thickness of 5 µm to 50 µm. The cover layer 160 is bonded to the copper foil layer 120 via the adhesive layer 140 and the cover layer 170 is bonded to the copper foil layer 130 via the adhesive layer 150, and then the cover layer 160 and the copper foil layer 120 are firmly bonded through hot-pressing, the cover layer 170 and the copper foil layer 130 are firmly bonded through hot-pressing as well. The reinforced plate 280 can be made of a non-metal plate having a certain strength, a stainless plate or an aluminum plate having a thickness of 0.1 mm or more, or a metal alloy plate having a certain strength. The reinforced plate 280 is fixed on the cover layer 160 through welding or adhesive.

Obviously, in the windowed area 190, the edge of the cover layer 160 may exceed the edge of the reinforced plate 280. In addition, the edge of the reinforced plate 280 may exceed the edge of the copper foil layer 120 and the edge of the cover layer 160. It is also possible to achieve the purpose of staggering the edge of the copper foil layer 120, the edge of the cover layer 160, and the edge of the reinforced plate 280 that defines the windowed area 190.

Third Implementation

Figure 5:
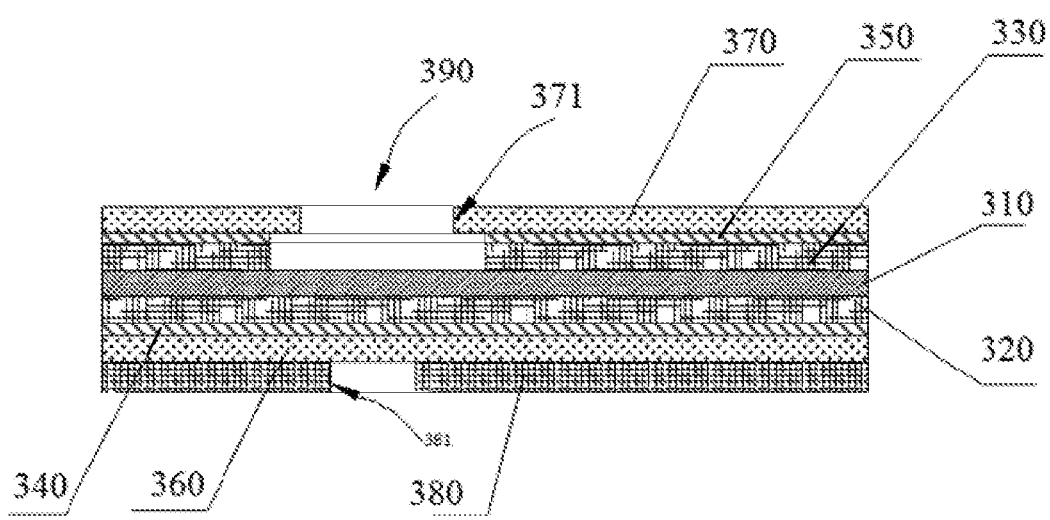
FIG. 5 is a schematic structural diagram of a third implementation of a flexible circuit board with a windowed area of the present disclosure.

Referring to FIG. 5, the FPC includes a dielectric layer 310, a copper foil layer 320, a copper foil layer 330, a cover layer 360, a cover layer 370, and a reinforced plate 380. The difference between the third implementation and the first/second implementation is that, the windowed area is formed on both sides of the dielectric layer 310.

The copper foil layer 320 is disposed on a lower surface of the dielectric layer 310 and the copper foil layer 330 is disposed on an upper surface of the dielectric layer 310. The cover layer 360 is covered on the outer side (that is, the side away from the dielectric layer 310) of the copper foil layer 320 and the cover layer 370 is covered on the outer side of the copper foil layer 330. The copper foil layer 320 and the cover layer 360 are connected via an adhesive layer 340. The copper foil layer 330 and the cover layer 370 are connected via an adhesive layer 350. The reinforced plate 380 is disposed on the outer side (that is, the side away from the adhesive layer 340) of the cover layer 360. The function of the reinforced plate 380 is to realize the local reinforcement of the FPC. The FPC includes a bending area as illustrated in FIG. 2. The bending area of the FPC is subjected to window processing, that is, the copper foil layer 330, the adhesive layer 350, and the cover layer 370 located on the upper surface of the dielectric layer 310 in the bending area as well as the reinforced plate 380 on the lower surface of the dielectric layer 310 in the bending area are cut off to form windowed areas. In other words, the windowed area of the copper foil layer, the adhesive layer, and the cover layer is provided on one side away from the reinforced plate 280. The edge of the cover layer 370 extends toward the inside of windowed area 390 of the cover layer 370 to form an extended edge 371. The extended edge 371 exceeds and covers the edge of the copper foil layer 330 and the edge of the adhesive layer 350. The edge of the reinforced plate 380 also extends toward inside of the windowed area 390 of the reinforced plate 380 to form an extended edge 381. The extended edge 381 exceeds and covers the edge 371 of the cover layer 370. Therefore, the staggered edges of the copper foil layer 330, the cover layer 370, and the reinforced plate 380 does not lie on one vertical plane.

In the implementation, by forming one windowed area on the side far away from the reinforced plate and staggering the edges of the copper foil layer 330, the cover layer 370, and the reinforced plate 380 in the vertical plane, the height drop between the edge of the copper foil layer and the edge of the reinforced plate is buffered, and the concentrated stress points are dispersed, so that the FPC will not be broken when the FPC is bent, and the bending resistance of the FPC can be enhanced.

Further, in an implementation of the edge reinforced structure of the bending area of the FPC, the extended edge 371 of the cover layer 370 may exceed the edge of the copper foil layer 330 and the edge of the adhesive layer 350 by more than 0.3 mm, such as 0.4 mm, 0.5 mm, 0.6 mm, or the like. Similarly, the edge of the reinforced plate 380 may exceed the edge of the cover layer 370 by more than 0.3 mm, such as 0.4 mm, 0.5 mm, 0.6 mm, or the like. If the extended edge 371 of the cover layer 370 extends too much in the windowed area or the edge of the reinforced plate 380 beyond the edge of the cover layer 370 is too long, the bending performance of the FPC will be affected. Therefore, the upper limit of the size that the extended edge 371 of the cover layer 370 exceeds the edge of the copper foil layer 330 and the edge of the adhesive layer 350 as well as the upper limit of the size that the edge of the reinforced plate 380 exceeds the edge of the cover layer 370 depends on the size of the windowed area 390.

Further, the copper foil layer 320 (or the copper foil layer 330) is composed of a rolled copper foil or an electrolytic copper foil having a thickness of 5 μm to 50 μm. The cover layer 360 (or the cover layer 370) is generally made of a polyimide (PI) film or a polyethylene terephthalate (PET) film having a thickness of 5 μm to 50 μm. The cover layer 360 is adhered to the copper foil layer 320 via the adhesive layer 340 and then firmly bonded through hot-pressing. The cover layer 370 is adhered to the copper foil layer 330 via the adhesive layer 350 and then firmly bonded through hot-pressing. The reinforced plate 380 can be made of a non-metal plate having a certain strength, or can be made of a stainless plate or an aluminum plate having a thickness of 0.1 mm or more, or can be made of a metal alloy plate having a certain strength and having a thickness of 0.1 mm or more. The reinforced plate 380 may be fixed on the cover layer 360 through welding or adhesive.

Obviously, in this implementation, the edge of the copper foil layer 330 may extend toward the inside of the windowed area 390 of the copper foil layer 330 to exceed the extended edge 371 of the cover layer 370. Likewise, the extended edge 371 of the cover layer 370 may exceed the edge of the reinforced plate 380. In this way, the copper foil layer 330, the cover layer 370, and the reinforced plate 380 can also be arranged in a stepped manner, so that the edges of the copper foil layer 330, the cover layer 370, and the reinforced plate 380 in the bending area are not aligned with each other in a vertical direction. Therefore, dispersing the concentrated stress points.

Obviously, in this implementation, the reinforced plate and the windowed area are disposed on different sides. As long as the edge of the copper foil layer 330, the edge of the cover layer 370, and edge of the opposite reinforced plate 380 in the bending area are staggered with each other in a vertical plane, the concentrated stress points can be dispersed, so that the FPC will not be broken when bending the FPC and the bending resistance of the FPC can be enhanced. Other forms of the edge reinforced structure will not be detailed herein.

Obviously, in the implementation of the present disclosure, the cover layer 360 can be directly covered on the copper foil layer 320 through a thermosetting process and the cover layer 370 can be directly covered on the copper foil layer 330 through a thermosetting process as well. In this case, the adhesive layer 340 and the adhesive layer 350 can be omitted.

The present disclosure also provides a mobile terminal adopting the above flexible printed circuit board. The mobile terminal may be a mobile phone, a tablet computer, a television, a display, a notebook computer, a digital photo frame, a navigator, and the like.

The above-mentioned implementations do not constitute any limitation on the protection scope of technical solutions. Any modification, equivalent replacement, and improvement made within the spirit and principle of the above implementations should be included within the protection scope of the technical solutions.

What is claimed is:

1. A flexible printed circuit board, comprising:
   a dielectric layer, wherein a copper foil layer and a cover layer are sequentially provided from inside to outside on each side of the dielectric layer, and the cover layer on one side of the dielectric layer is provided with a reinforced plate; and
   a bending area operated to be bent in use, wherein the copper foil layer and the cover layer on one side at the dielectric layer and the reinforced plate are each provided with a windowed area, wherein the reinforced plate with the windowed area and the copper foil layer with the windowed area are arranged at the same side of the dielectric layer, and edges of the copper foil layer, the cover layer, and the reinforced plate that define the windowed areas are not in one vertical plane,
   wherein the cover layer and the copper foil layer are connected via an adhesive layer, the adhesive layer is provided with a windowed area, the edge of the cover layer that defines the windowed area of the cover layer extends beyond and covers corresponding edges of the copper foil layer and the adhesive layer, and the edge of the reinforced plate that defines the windowed area of the reinforced plate extends beyond and covers the edge of the cover layer that defines the windowed area of the cover layer.

2. The flexible printed circuit board of claim 1, wherein the edges of the copper foil layer, the adhesive layer, the cover layer, and the reinforced plate that define the windowed areas are arranged in a stepped manner.

3. The flexible printed circuit board of claim 1, wherein the cover layer and the copper foil layer are connected via an adhesive layer, the windowed areas of the copper foil layer, the adhesive layer, and the cover layer and the windowed area of the reinforced plate are arranged on different sides of the dielectric layer.

4. The flexible printed circuit board of claim 3, wherein the edge of the cover layer extends toward inside of the windowed area of the cover layer to exceed and cover the edge of the copper foil layer and the edge of the adhesive layer, and the edge of the reinforced plate defined by the windowed area of the reinforced plate exceeds the edge of the cover layer defined by the windowed area of the cover layer.

5. The flexible printed circuit board of claim 1, wherein a horizontal distance of any two of the edges of the copper foil layer, the adhesive layer, the cover layer, and the reinforced plate that define the windowed area is not less than 0.3 mm.

6. The flexible printed circuit board of claim 1, wherein the reinforced plate is made of a metal alloy plate.

7. The flexible printed circuit board of claim 1, wherein the windowed areas are axis-symmetric in a vertical direction.

8. A mobile terminal, comprising:
   a flexible printed circuit board;
   wherein the flexible printed circuit board comprises:
     a dielectric layer, wherein a copper foil layer and a cover layer are sequentially provided from inside to outside on each side of the dielectric layer, and the cover layer on one side of the dielectric layer being provided with a reinforced plate; and
     a bending area operated to be bent in use, wherein the copper foil layer and the cover layer on one side at the bending area and the reinforced plate are each provided with a windowed area, wherein the reinforced plate with the windowed area and the copper foil layer with the windowed area are arranged at the same side of the dielectric layer, and edges of the copper foil layer, the cover layer, and the reinforced plate that define the windowed areas are not aligned with each other,
     wherein the cover layer and the copper foil layer are connected via an adhesive layer, the adhesive layer is provided with a windowed area, the edge of the cover layer that defines the windowed area of the cover layer extends beyond and covers corresponding edges of the copper foil layer and the adhesive layer, and the edge of the reinforced plate that defines the windowed area of the reinforced plate extends beyond and covers the edge of the cover layer that defines the windowed area of the cover layer.

9. The mobile terminal of claim 8, wherein the edges of the copper foil layer, the adhesive layer, the cover layer, and the reinforced plate that define the windowed areas are arranged in a stepped manner.

10. The mobile terminal of claim 8, wherein the cover layer and the copper foil layer are connected via an adhesive layer, and the windowed areas of the copper foil layer, the adhesive layer, and the cover layer and the windowed area of the reinforced plate are arranged on different sides of the dielectric layer.

11. The mobile terminal of claim 10, wherein the edge of the cover layer extends toward inside of the windowed area to exceed and cover the edge of the copper foil layer and the edge of the adhesive layer, and the edge of the reinforced plate defined by the windowed area of the reinforced plate exceeds the edge of the cover layer defined by the windowed area of the cover layer.

12. The mobile terminal of claim 8, wherein a horizontal distance of any two of the edges of the copper foil layer, the adhesive layer, the cover layer, and the reinforced plate that define the windowed areas is not less than 0.3 mm.

13. The mobile terminal of claim 8, wherein the reinforced plate has a thickness greater than or equal to 0.1 mm.

14. The mobile terminal of claim 8, wherein the reinforced plate is fixed on the cover layer through welding or adhesive.

15. A flexible printed circuit board, comprising:
   a dielectric layer;
   two copper foil layers, wherein one copper foil layer is coupled to one side of the dielectric layer and the other copper foil layer is coupled to the other side of the dielectric layer;
   two cover layers, wherein one cover layer is coupled to one copper foil layer and the other cover layer is coupled to the other copper foil layer;
   a reinforced plate, stacked on one cover layer; and
   the reinforced plate is provided with a first windowed area, one of the two copper foil layers and one of the two cover layers on the same side of the dielectric layer are provided with a second windowed area and a third windowed area respectively, wherein orthographic projection of the first, second, and third windowed areas on the dielectric layer are overlapped, wherein the reinforced plate with the first windowed area and the copper foil layer with the second windowed area are arranged at the same side of the dielectric layer, and the first, second, and third windowed areas are within a bending area operated to be bent in use,
   wherein the cover layer and the copper foil layer are connected via an adhesive layer, the adhesive layer is provided with a fourth windowed area, the edge of the cover layer that defines the third windowed area of the cover layer extends beyond and covers corresponding edges of the copper foil layer and the adhesive layer, and the edge of the reinforced plate that defines the first windowed area of the reinforced plate extends beyond and covers the edge of the cover layer that defines the third windowed area of the cover layer.

16. The flexible printed circuit board of claim 15, wherein the second windowed area is vertically extended into the adhesive layer which is on the same side of the dielectric layer as the second windowed area.

17. The flexible printed circuit board of claim 16, wherein the first, second, and third windowed areas are different in areas and are axis-symmetric in a vertical direction.

18. The flexible printed circuit board of claim 15, wherein the first windowed area is larger than the second and third windowed areas.

* * * * *